United States Patent [19]
Hesselink et al.

[11] Patent Number: 4,927,220
[45] Date of Patent: May 22, 1990

[54] SYSTEM AND METHOD FOR PHOTOREFRACTIVE HOLOGRAPHIC RECORDING AND SIGNAL PROCESSING

[75] Inventors: Lambertus Hesselink, Woodside, Calif.; Steve R. Redfield, Austin, Tex.

[73] Assignee: Microelectronic & Computer Technology Corp., Austin, Tex.

[21] Appl. No.: 140,196

[22] Filed: Dec. 31, 1987

[51] Int. Cl.$^5$ .......................... G03H 1/02; G02F 1/05
[52] U.S. Cl. ................................ 350/3.64; 350/162.12
[58] Field of Search ............. 350/3.64, 162.12, 162.13, 350/162.14

[56] References Cited

U.S. PATENT DOCUMENTS

| | | | |
|---|---|---|---|
| 3,454,414 | 7/1969 | Andes et al. | |
| 3,652,145 | 3/1972 | Thaxter | |
| 3,861,784 | 1/1975 | Torok | 350/3.64 X |
| 4,138,189 | 2/1979 | Huignard et al. | 350/3.64 |
| 4,410,240 | 10/1983 | Medernach | |
| 4,655,542 | 4/1987 | Dube | 350/3.64 |
| 4,674,824 | 6/1987 | Goodman et al. | 350/3.64 |
| 4,786,149 | 11/1988 | Hoenig et al. | |

OTHER PUBLICATIONS

Ramberg, "Holographic Information Storage", RCA Review, vol. 33, Mar. 1972, pp. 5–53.
Staebler et al., "Multiple storage and erasure of fixed holograms in Fe-doped LiNbO$_3$", Appl. Phys. Ltrs., vol. 26, No. 4, 15 Feb. 1975, pp. 182–184.
Edited by H. M. Smith, "Holographic Recording Materials", Springer-Verlag Berlin Heidelberg, New York 1977, pp. 12–16.
Caulfield, "Handbook of Optical Holography", 1979, pp. 404–407.
Vachss et al., "Holographic beam coupling in anisotropic photorefractive media", vol. 4, No. 27/Feb. 1987/J. Opt. Soc. Am. A, pp. 325–329.
Smith, "Principles of Holography", Second Edition, pp. 49–75.
Yariv, "Optical Electronics", Third Edition, pp. 54–86.
Gowar, "Optical Communication Systems", pp. 24–70.

*Primary Examiner*—Bruce Y. Arnold
*Assistant Examiner*—David R. Parsons
*Attorney, Agent, or Firm*—Philip A. Dalton

[57] ABSTRACT

A photorefractive crystallyte array for image recording and signal processing is disclosed. The photorefractive crystallytes are configured as a two-dimensional array of selected position and spacing designed, for example, to coincide with the spatial frequency components of an associated optical image, such as a Fourier transform image, and to permit optical signal processing.

26 Claims, 7 Drawing Sheets

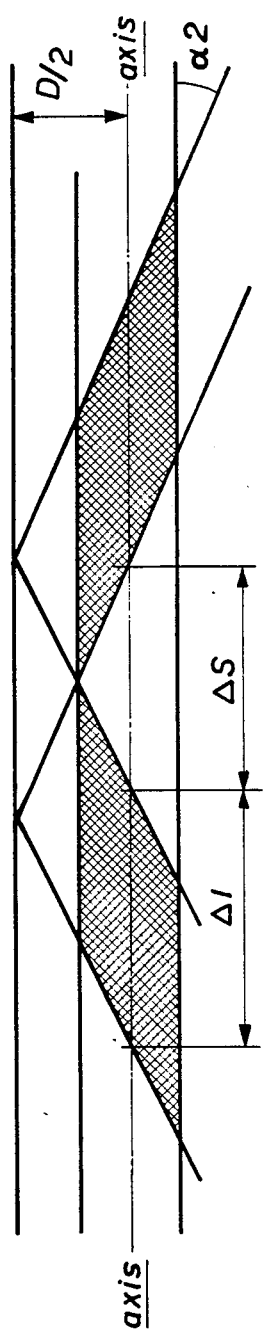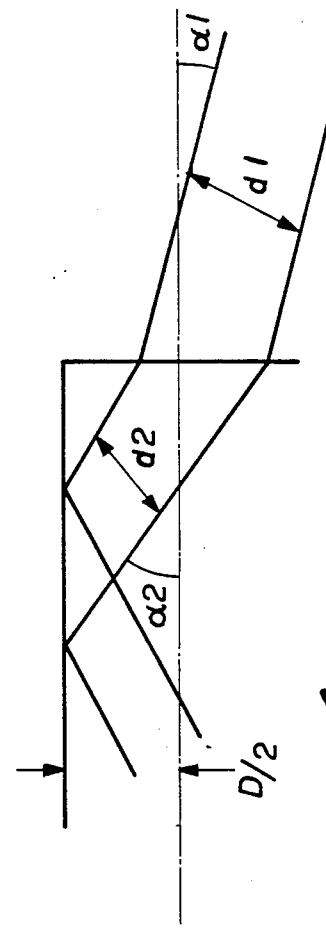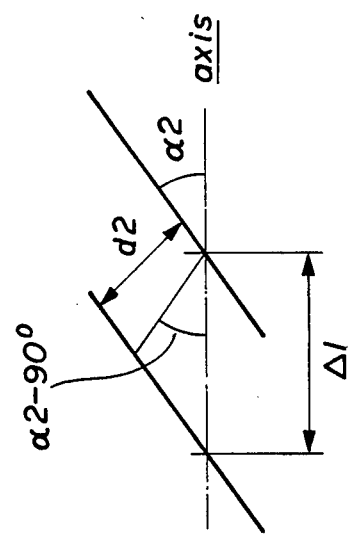
FIG-3
FIG-4

SYSTEM AND METHOD FOR PHOTOREFRACTIVE HOLOGRAPHIC RECORDING AND SIGNAL PROCESSING

BACKGROUND OF THE INVENTION

The present invention relates to holographic recording using a matrix or other configuration, including a geometric configuration, of discrete photorefractive elements. The invention also relates to the use of photorefractive elements and associated matrices for signal processing.

It is well known that bulk photorefractive crystals have been used for applications such as data storage, defect enhancement, optical correlation and convolution, optical interconnects and associative memories. These applications have used mostly commercially available bulk crystals such as the ferroelectrics LiNbO$_3$ (lithium niobate) and SBN (strontium barium niobate) and the paraelectric BSO (bismuth silicon oxide).

The bulk photorefractive crystals usually are used in a cubic configuration, have a side dimension of about one centimeter and a depth or length of about one-half centimeter. It is difficult to grow larger crystals of good optical quality and, in fact, it is difficult to grow electro-optically superior crystals such as BaTiO$_3$ (barium titanate) and SBN to even half the stated cross-section. As a consequence of this difficulty in making large bulk crystals, and, additionally as a result of the need for sophisticated, expensive optics to image high resolution patterns (greater than 30 lines per millimeter) onto large surfaces (greater than a few millimeters on a side) without distortion, the inability to selectively control regions of bulk material, and the limitation of certain bulk photorefractive materials to first order nonlinear optical effects (because of the inability to sustain high enough energy densities), wide spread application of photorefractive technology using bulk crystals has not occurred, despite an initial surge of development in the decade of the 1970's.

In the past, composite arrays have been used to simulate bulk materials in imaging applications, e.g., to function equivalently to a single element lens. However, these arrays have been constructed of linear materials such as glass fibers. In addition, the elements of an array formed from such materials cannot be addressed individually. Quite obviously, such materials are not useful for data storage or signal processing.

BEAM ANALYSIS FOR PHOTOREFRACTIVE RECORDING AND SIGNAL PROCESSING

A. Propagation of Light Through a Fiber

For the purpose of providing a framework for discussion of the present invention, we will briefly discuss light propagation in glass fibers, using conventional analysis. This material will provide guidance for the analysis and discussion of the optical properties of fibers made of nonlinear optical or photorefractive materials. For the discussion, we assume a cylindrical coordinate system shown in FIG. 1 and use the following nomenclature:

K$_0$ = propagation vector in free space
K$_1$ = propagation vector in crystallyte
($\phi$,r) = polar coordinates of entrance spot
d = beam diameter
a = crystallyte diameter
L = crystallyte length
n$_0$ = index of free space
n$_1$ = index of crystallyte material
n$_2$ = index of cladding 1. Ray Approximation As described in standard textbooks, ray propagation in a fiber may be described by considering Maxwell's equations and appropriate boundary conditions. J. Gower, *Optical Communication Systems*, Prentice Hall, 1984; A. Yariv, *Optical Electronics*, Holt, Rinehart and Winston, 1985. The solution involves finding expressions for Er, E$\phi$, Hr and H$\phi$ in terms of Ez and Hz. It thus suffices to determine Ez and Hz in order to uniquely specify the wave solution. Taking into account the boundary condition that Ez, E$\phi$, Hz and H$\phi$ must be continuous at r=a, the solution becomes:

$$\begin{bmatrix} E \\ H \end{bmatrix} = \begin{bmatrix} C_1 \\ C_2 \end{bmatrix} J_q(\text{hr})\cos(q\phi), \quad [1]$$

where h denotes the difference between the actual and the effective propagation vectors in the fiber, C$_1$ and C$_2$ are constants, and J$_q$ is a Bessel function of the first kind of order q, where q is an integer.

Only certain discrete values of h are permitted for each value of q, because we are dealing with an eigenvalue problem. We now have a discrete set of values for all h's, which we refer to as $\{h_{qm}\}$. This set corresponds to the possible modes of propagation in the fiber. Each $h_{qm}$, determines a $\beta$, denoted $\beta$qm and from equation 1 above we obtain $$\beta_{qm}^2 = K_1^2 - h_{qm}^2. \quad [2]$$

In many cases of practical interest when a fiber is short enough or has a relatively large diameter, one may treat the propagation within the fiber in terms of rays or beams of light.

Modes with q=0 correspond to solutions in which the field patterns have radial symmetry. In a ray approximation each of these (0,m) modes could be thought to correspond to a set of meridional rays. The higher the mode (larger m), the greater the obliqueness to the fiber axis. There are two sets of solutions, those for which Hz is zero, designated transverse magnetic modes (TM$_{om}$), and those for which Ez is zero, designated transverse electric modes (TE$_{om}$).

Looking more closely at q=0 modes, the above boundary condition again restricts the values of h0$_m$ to $$t_{0,m} < h_{0m}a < t_{0,m+1}, \quad [3]$$

where tq,m is the mth root of Jq(x)=0. The values of these roots can now be approximated by the formula $$t_{0,m} \simeq (m-\tfrac{1}{4})\pi. \quad [4]$$

This provides us for the interval between permissible h$_{om}$ values $$\Delta t_{0,m} \simeq \pi, \quad [5]$$

and $$\Delta h_{0m} \simeq \pi/a. \quad [6]$$

In a ray approximation, the mode propagation vector, $\beta$, defines the phase velocity in the direction of the ray, while the bulk propagation vector, K$_1$, defines the apparent phase velocity in the direction of the axis. It can also be seen that for q+0 modes, $\alpha_2 \neq 0$ ($\alpha_2$ is defined below). The mode propagation vector, $\beta$, is now related to the bulk propagation vector $K_1$ as follows:

$$\beta_{om} = K_1 \cos \alpha_1. \quad [7]$$

We now get for the interval between permissible $\alpha_1$ angles:

$$\Delta h_{om} = \frac{\pi}{a} = \Delta (K_1^2 - \beta_{Om}^2)^{\frac{1}{2}} \quad [8]$$

$$(K_1^2 - \beta_{Om}^2)^{\frac{1}{2}} = (K_1^2 - K_1^2 \cos^2\alpha_1)^{\frac{1}{2}} = K_1 \sin \alpha_1$$

$$\Delta \sin \alpha_1 = \frac{\pi}{aK_1} = \frac{\lambda}{2n_1 a}$$

$$\Delta \alpha_1 = \sin^{-1}\left(\frac{\lambda}{2n_1 a}\right).$$

In general, many modes may be available for propagation depending on the geometry and physical properties of the propagation medium. For the fibers in which the diameter is relatively large, the number of possible propagating modes is very extensive, and often for practical purposes we may assume that the propagation modes are continuous. The number of modes (for an isotropic material) is given by:

$$T_m = \frac{2 \pi^2 a^2}{\lambda^2 (n_o^2 - n_1^2)}. \quad [9]$$

Which mode a beam propagates in is determined by its orientation as it enters the fiber. The position of a beam is completely specified by K, r, and $\phi$, where K is the propagation vector of the wave.

Referring to FIG. 2, to completely specify the K vector, we use two angles that it projects onto two orthogonal planes. We let the first, $\alpha_1$, be the angle between the projection of $K_1$ into the plane containing r and the z-axis. It describes the radial nature of the propagation. The second angle, $\alpha_2$, is the angle between the projection of $K_1$ onto the plane defined by $\phi$ and the $\phi$-r plane. It describes the helical nature of the propagation. If $\alpha_2 = 0$, the beam always stays in a plane (which contains the z axis) and is called a meridional beam. The analogs to $\alpha_1$ and $\alpha_2$ in the crystallyte elements used by us are $\beta_1$ and $\beta_2$.

In summary, the above discussion indicates that wave propagation in an ideal fiber is limited by constraints, and that propagation is possible in discrete modes.

2. Longer Interaction Length

Assume for simplicity that a recording is achieved by two plane wave mixing producing a grating of a particular spatial frequency. In this context, it can be shown that recording of an image (by replacing one of the plane waves with an information carrying image beam) results in a modulation of the grating.

Using the ray approximation for the analysis, we can compute, in an approximate fashion, the path length of rays propagating through the fiber. We will assume that the image carrying beam, $P_1$, propagates along the bore of the fiber, $d_1 < D$, where $d_1$ is the diameter of the beam and D is diameter of the fiber and that no substantial diffraction occurs. The other beam, $P_2$, is assumed to reflect from the fiber walls. We will assume $P_2$ is meridional.

Assuming a one-dimensional analysis, when $P_2$ is incident at angle $\alpha_1$ outside the medium, the angle $\alpha_2$ inside the medium is:

$$\alpha_1 = \sin^{-1}\left(\frac{1}{n_1} \sin \alpha_2\right), \quad [10]$$

where $n_1$ is the index of diffraction of the fiber material.

The separation between interference areas, $\Delta S$, is illustrated in FIGS. 3 and 4 where:

$$\Delta S = \frac{(D/2) \cdot 2}{\tan \alpha_2} = \frac{D}{\tan \alpha_2}. \quad [11]$$

The interaction length, $\Delta l$, is:

$$\cos \alpha_2 = \frac{d_2 \cos \alpha_1}{d_1} \quad [12]$$

$$d_2 = \frac{d_1 \cos \alpha_2}{\cos \alpha_1} \quad [13]$$

$$\frac{d_2}{\Delta l} = \cos (90° - \alpha_2) = \sin \alpha_2 \quad [14]$$

$$\Delta l = \frac{d_2}{\sin \alpha_2} = \frac{d_1 \cos\alpha_2}{\sin\alpha_2 \cos\alpha_1} = \frac{d_1}{\tan\alpha_2 \cos\alpha_1}. \quad [15]$$

The number of interaction regions per length L is then:

$$\text{number of regions} = \frac{L}{d_1} \tan \alpha_2 \cos \alpha_1. \quad [16]$$

In a more general case, the interaction between the two waves may be computed using coupled wave analysis in waveguides.

B. Photorefractive Recording

For data storage applications, multiple holograms are recorded in the photorefractive medium. To guide the understanding of and provide a framework for describing data storage in fibers, we briefly state important design considerations, using conventional holographic principles.

1. Available Dynamic Range

The total available index modulation of a phase recording material limits the number of superimposed recordings. For 100 percent efficient recordings, the maximum number is obtained from (Gaylord, Thomas K., Digital Data Storage, *Handbook of Optical Holography*, Academic Press, 1979):

$$\text{pages} = [\sin^{-1}\sqrt{\eta}] \cdot \frac{D \cdot \Delta n}{\lambda \cdot \cos \theta_c}. \quad [17]$$

2. Efficiency of Reconstruction

The efficiency of reconstruction for a thick phase transmission hologram with absorption is determined by (Smith, H. M., *Holographic Recording Materials*, Springer-Verlag, N.Y., 1977):

$$\eta = \exp\left[-\frac{2 \alpha \cdot D}{\cos \theta_c}\right] \cdot \sin^2\left[\frac{\pi \cdot \Delta n \cdot D}{\lambda \cdot \cos \theta_c}\right], \quad [18]$$

where it is assumed that the Bragg condition (see above) is satisfied.

The efficiency of reconstruction oscillates as a function of D for a transmission hologram. This implies than an optimum thickness D needs to be determined for a transmission hologram by balancing the requirements for angular and wavelength sensitivity against the requirement for high efficiency reconstruction. The efficiency will be at a maximum when $$\frac{\pi \cdot \Delta n \cdot D}{\lambda \cdot \cos \theta_c} = \text{odd multiple of } \frac{\pi}{2} \qquad [19]$$

or just considering the 1st multiple:

$$2 \Delta n \cdot D = \lambda \cdot \cos \theta_c. \qquad [20]$$

For anisotropic materials, the efficiency versus angular detuning curve is modified, as explained by Vachss and Hesselink.

3. Bragg Selectivity

The angular sensitivity is the angular rotation required to extinguish the image formed with a hologram of thickness D which is recorded and reconstructed with light of wavelength $\pi$ (Smith, H. M., *Principles of Holography*, John Wiley, N.Y., 1975):

$$\Delta \theta_c = \frac{\lambda}{D \cdot \sin \theta_r} \qquad [21]$$

in the case for which the object wave is normally incident. The general case is determined by:

$$\Delta \theta_c = \frac{\lambda}{D} \frac{\cos \theta_o}{\sin \theta_r \cos \theta_o - \sin \theta_o \cos \theta_r}. \qquad [22]$$

From the above discussion, it can be seen that the efficiency of a reconstructed image is very dependent on how close the reconstruction beam is to the position determined by the Bragg angle. The number of superimposed pages (recordings) is limited not only by the available dynamic range (see above), but also by the Bragg selectivity or the fall off in coupling efficiency as the reconstruction reference beam moves away from the recording reference beam angle.

From Gaylord, Thomas K., "Digital Data Storage", *Handbook of Optical Holography*, Academic Press, 1979, this selectivity is a function of the following:

$$\Delta \theta_c = \frac{\gamma \cdot n \cdot L}{D} = \left(\frac{\gamma \cdot n}{2}\right) \frac{\lambda}{D \cdot \sin \theta_c}. \qquad [23]$$

The angular selectivity co-efficient, $\gamma$, relates to index modulation or efficiency and Gaylord has given it a value of 0.886 to 0.799. If the range of angles of the reference beam outside of the crystal is $\phi$, then the total number of recordings, or pages, which can be superimposed is limited to:

$$\text{number of pages} < \frac{\phi}{\Delta \theta_c} = \frac{\phi \cdot D}{\gamma \cdot n \cdot L}. \qquad [24]$$

4. Electric Field Enhancement

Electric field enhancement is achieved by applying a voltage across the crystal in the appropriate direction. Most crystals of interest such as BSO, BGO, SBN exhibit a rather strong dependence of efficiency on applied electric field. The index modulation produced under the influence of incident radiation is directly proportional to the applied field, and within a phase shift:

$$\Delta n = \text{const} \cdot E_a. \qquad [25]$$

Thus, it is advantageous to apply a field to increase diffraction efficiency during recording. The effectiveness of the applied field depends however, on the spatial frequency of the grating.

5. Crosstalk

A very important, fundamental limitation is imposed by the cross coupling between multiple holograms superimposed in the crystallyte material. The cross coupling or intermodulation terms are strongly dependent on the angular offset of the images and the angular sensitivity of the medium. By varying the offset angle, the intermodulation terms can be minimized, but usually at the expense of limiting the number of holograms which can be superimposed.

The random nature of the data patterns produces statistical background noise and the number of superimposed holograms is severely limited by this effect. The limit is (Ramberg, E. G., RCA Review, Vol 33, 1972, pp 5–53):

$$\text{pages} < \frac{D}{4 \cdot \lambda \cdot SNR^2}. \qquad [26]$$

C. Fixing

One of the conventional ways of enhancing the stability of a recording is by fixing. A number of the materials discussed here can be fixed. There are several general mechanisms by which this can be accomplished, including fixing by applying voltage or temperature treatments. A new method involves using a combination of polarization rotation and applied fields which are different during recording and reconstruction. A combination may also be used. Here we discuss fixing methods involving electrical and temperature effects.

1. Electrical

In some ferroelectric materials, the coercive field is sufficiently low to allow fixing by applying an electric field which reverses the intrinsic polarization of the crystal. This field is Ec=970 V/cm for SBN (depending somewhat on composition) and 40 V/cm higher for BaTiO$_3$. After application of this field to the recorded hologram, a domain reversal pattern results which mimics the space charge field distribution and can be read out without erasure.

For SBN, voltage fixing is reported to have been accomplished by applying a 1.25 Kv/cm field for 500 ms.

A typical fixing cycle consists of first poling the crystal to align all domains with a field well above the coercive field (a nominal value being 2 kV/cm for SBN). A complete recording-reconstruction procedure involves the initial poling, followed by another poling and hologram recording step, then the cycle is completed by the final fixing step. Fixing occurs by applying a field of 1.25 kV/cm antiparallel to the original poling field for 0.5 sec. Polarization reversal occurs in those regions where the space charge field and the applied field exceed the coercive field. As a result, a domain pattern is created which mirrors the original space charge field.

The trapped charges are neutralized and the efficiency of the hologram reconstruction is very low. Subsequent exposure to light liberates the trapped charges and the hologram reappears with increased efficiency. Erasure is achieved by applying another poling field.

2. Thermal

Ferroelectric crystals exhibit a Curie temperature which allows fixing in such crystals by making use of thermally activated ionic conductivity. Fixing can be carried out either during recording or after the hologram has been formed.

For example (Staebler, D. L., "Multiple Storage and Erasure of Fixed Holograms in Fe-doped LiNbO$_3$", *Appli. Phys. Lett.*, Vol. 26, p. 182, 1975), in LiNbO$_3$ the sample is heated either during or after recording. At temperatures above 100° C., the ionic conductivity is large enough to neutralize the space charge patterns of the hologram, without redistributing the trapped electrons. Consequently, an ionic charge pattern complementary to the space charge field pattern results. Upon cooling, this pattern is frozen and illuminated with a uniform intensity field. A fraction of the electrons is liberated and the ionic pattern reveals the hologram; such a hologram can be reconstructed without erasure.

Thermal fixing procedures have also been developed for SBN, by heating the crystal above the Curie temperature (about 78° C. for SBN:60). The hologram is written while the crystal is heated and by cooling below the Curie temperature a transition takes place from the paraelectric to the ferroelectric state. The electric field patterns then induce corresponding domain patterns which can be reconstructed without erasure.

The time required for fixing depends on the ionic conductivity. For LiNbO$_3$ at 250, the fixing time is about 0.5 seconds. This time increases to 30 seconds at approximately 160. In general, the fixing time is given by:

$$\tau = \frac{\epsilon}{\sigma},\qquad [27]$$

where $\epsilon$ denotes the dielectric constant and $\sigma$ is the conductivity. Erasure of the fixed hologram is accomplished by heating the crystal about 100° C. and by exposure to uniform illumination. In that case, both the ionic and electronic patterns are erased.

SUMMARY OF THE INVENTION

It is the primary object of the present invention to provide a system and methods for photorefractive holographic recording and signal processing which are not subject to the shortcomings of the conventional bulk photorefractive recording technology discussed above in the Background of the Invention.

The system for achieving this objective and other objectives comprises an array of photorefractive crystallytes, either cubits or fibers, which are assembled in a matrix to synthesize a larger volume. Typically, the cross-sectional dimension of each cubit or fiber is less than one millimeter and in the case of fibers such as SBN, the length can be very great, presently of the order of ten's of centimeters. The array geometry can be tailored to specific applications and may take different configurations such as, for example, rectangular arrays, hexagonal close-packed arrays, concentric rings and special patterns which are optimized for recording the spatial frequency components of interest in the Fourier plane of the image (for example, to effect image processing applications such as pattern recognition).

Crystallytes can be used for Fourier transform holographic storage where holograms of the fourier transforms of images are recorded. Usually several recordings are placed in the same region of the material, each with a different Bragg angle. This overlay of recordings is called a stack. A crystallyte is used for each stack.

The matrix configuration of photorefractive crystallytes is uniquely adaptable to signal processing applications by selectively enhancing/diminishing spatial frequency components which can be imaged at the different cubit/fiber locations. For example, the cubits or fibers of a matrix may be individually addressed by incorporating row/column-type individual addressing for selectively applying voltages or temperature changes to the individual crystallyte/data points.

The waveguide transmission in fibers provides higher energy densities over extended lengths than are possible for free-space bulk material propagation and permits the realization and use of non-linear electro-optic effects. In holographic recording applications, longer interaction lengths imply increased angular sensitivity and therefore higher data storage capacity. These advantages are, of course, in addition to the ability to synthesize a much larger imaging cross-sectional area than is currently attainable using bulk materials.

BRIEF DESCRIPTION OF THE DRAWINGS

FIGS. 3 and 4 are schematic representations of the various beam angles and interaction regions inside a fiber;

DETAILED DESCRIPTION OF THE INVENTION

A. Construction of Photorefractive Array

The underlying concept of the present invention is to use a photorefractive composite array of small, isolated optical recording volumes called crystallytes in place of a bulk crystal of that material. These crystallytes may be touching or physically separated. Isolation may be achieved by the refractive index differences, coatings on the sides, or the intervention of a substrate material.

Figure 6:
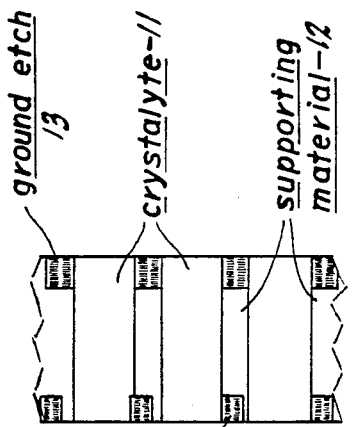
FIGS. 6 and 7 are partial cross-sectional views taken along lines 6—6 and 7—7 in FIG. 5.
Figure 7:
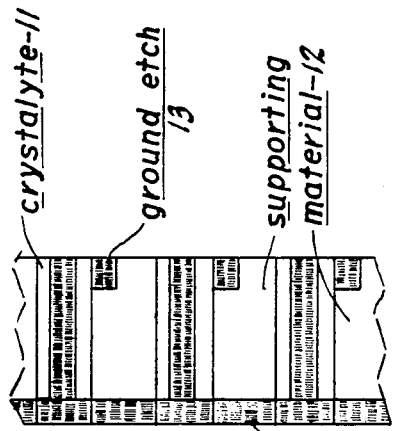
Figure 5:
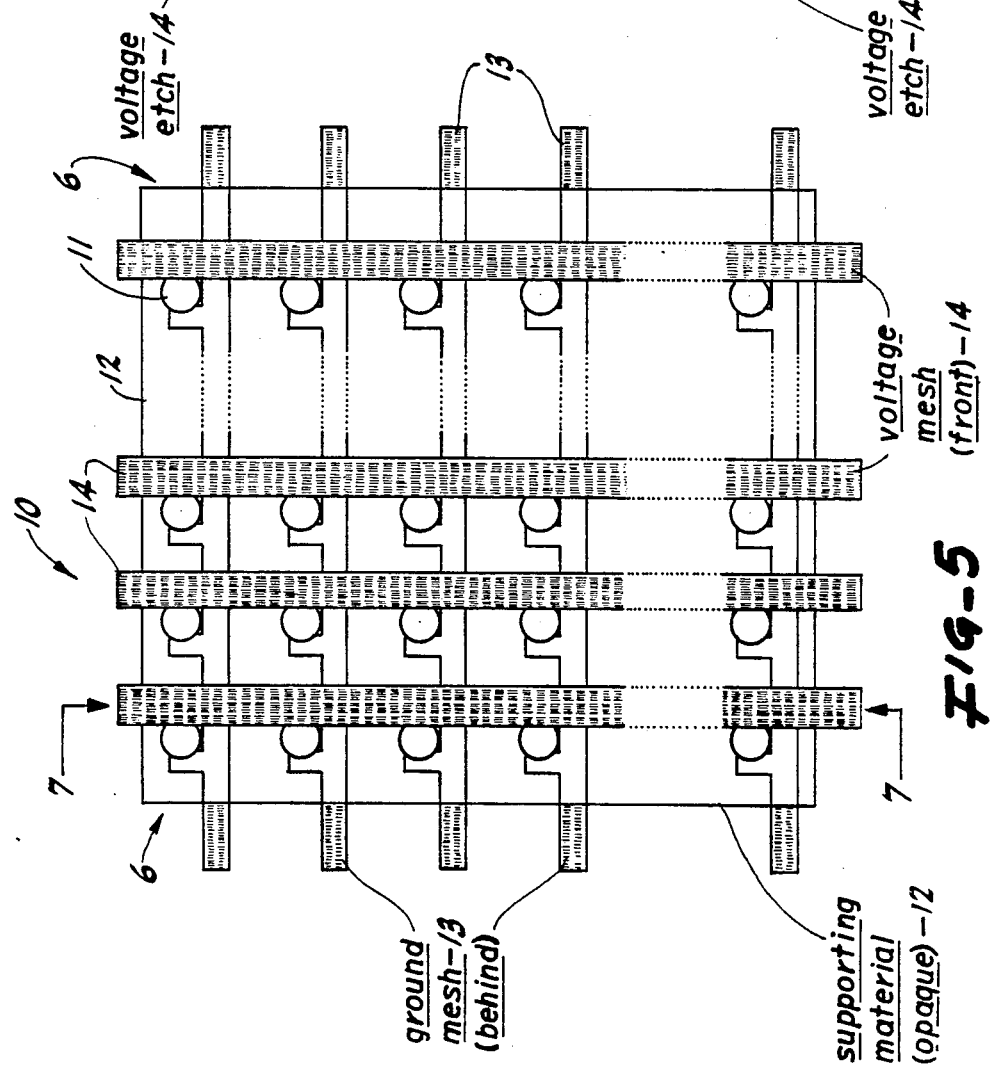
FIG. 5 is a schematic representation of a composite element photorefractive system which embodies the principles of the invention.

Referring to FIGS. 5–7, which illustrate one embodiment of the photorefractive composite array 10, optically aligned crystallytes 11—11 are mounted in a two-dimensional array within a dimensionally stable and, preferably, electrically and optically insulating material 12 such as, for example, bakelite. Illustratively, the crystallytes 11 are configured as an xy, row-by-column array but essentially any two-dimensional array or configuration can be used, including spatial arrays which, e.g., correspond to the spatial frequency or to certain selected spatial frequencies of images recorded in the Fourier domain.

Referring further to FIGS. 5–7, the crystallytes are cubits or fibers. Cubits typically are small (on the order of 1 millimeter by 1 millimeter by several millimeters) photorefractive volumes, for example, rectangular or hexagonal volumes, formed by cutting or cleaving from a larger, conventionally grown crystal volume such as a boule. Fibers are long single crystals (on the order of less than a millimeter to 1-2 millimeters in diameter), which are conventionally formed by drawing, then cutting a crystal to the correct length (typically on the order of several millimeters but certain applications may use longer lengths to take advantage of energy channeling).

Referring still further to FIGS. 5–7, where the crystallytes 11 are cubits, they are mounted within the matrix 12 usually with their optic axes aligned in the same direction (exceptions, of course, exist as some applications may want different alignments), preferably parallel to the large face or plane of the matrix for recording in crystals such as BSO (a cubic crystal), or SBN (a tetragonal crystal), or perpendicular to the plane or faces of the matrix, for example, for reflection recording in BSO or SBN. Where the crystallytes 11 are fibers, the optical axis of an SBN fiber is normally in the direction of the fiber axis, although this can be modified somewhat during the growth of the fiber. For other materials, the optic axis may be oriented differently to take advantage of the electro-optic properties of the medium for a specific recording configuration.

If voltage enhancement (described below) is desired, the direction of the fiber optical axis is taken into account when determining the direction of the applied field. The relationship between these directions depends on the exact nature of the non-linear optical properties of the material, that is, on the coefficients of the electro-optic tensor. As alluded to above, for tetragonal crystals such as SBN, the recording must be done by reflection as the grating vector, the optical axis, and the applied electric field must all be in the same direction, assuming that the optical axis is along the fiber axis. Some fibers have facets which would allow beams to enter from the sides and the optic axis is such that the grating vector is usually oriented in the direction corresponding to the largest electro-optic coefficient.

To provide selective application of an electric field, electrodes can be applied to the faces of the crystallytes 11 by depositing a conducting pattern on the supporting structure 12 and forming a transparent conducting coating such as $TiO_2$ on the ends of the crystallytes. Alternatively, the electrodes can be placed on the sides of the crystallytes, and the sides can be coated with the conductor before assembly into the matrix. A voltage mesh, here an xy row-by-column array of ground conductors 13 and voltage conductors 14, is formed on the back and front sides, respectively, of the support matrix 12 so that voltage can be selectively applied to each crystallyte via the associated electrode coatings.

In addition, electrically resistive heating elements can be formed on the individual crystallytes 11—11 for selectively heating the crystallytes. For example, the crystallytes can be coated with a resistive material before assembly into the support structure 12 or heating components can be built into the support structure. Preferably, the support structure 12 also provides thermal insulation. An electrical conductor pattern is deposited or otherwise formed on the surface or inside the support structure 12 to provide individual control of the temperature of each crystallyte. The electrical conductors for the heating elements can be routed separately from the conductors for the voltage electrodes. Alternatively, the heating and voltage conductors can be routed together. In this latter case, each row and column conductor element 13 or 14 is a composite of a ground (or voltage) conductor, a heating element conductor and an intermediate electrical insulator.

B. Improved Image Storage and Signal Processing

The analysis of recording in photorefractive fibers is complicated by the potential mode structure of propagation. The model developed previously in the Background of the Invention section strictly applies only to isotropic materials, but we will use it to show the general advantages of the invention. It is expected that while this approximation is not entirely correct for photorefractive fiber recording, the general conclusions are still valid.

Figure 1:
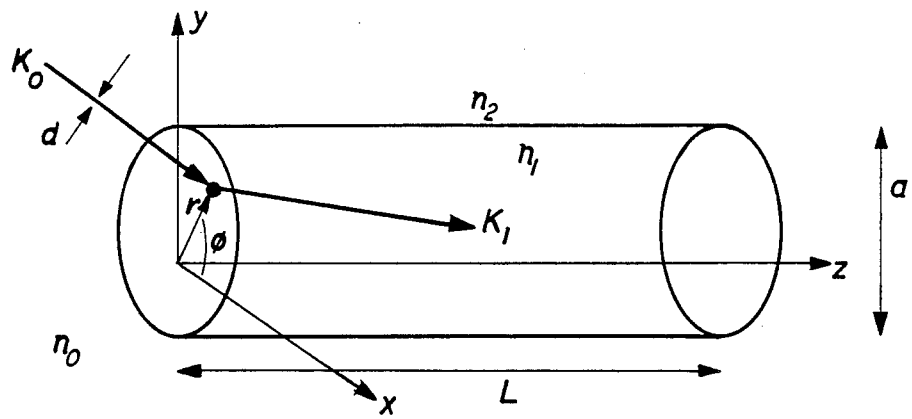
FIG. 1 depicts the coordinate system and nomenclature used in the background discussion.
Figure 2:
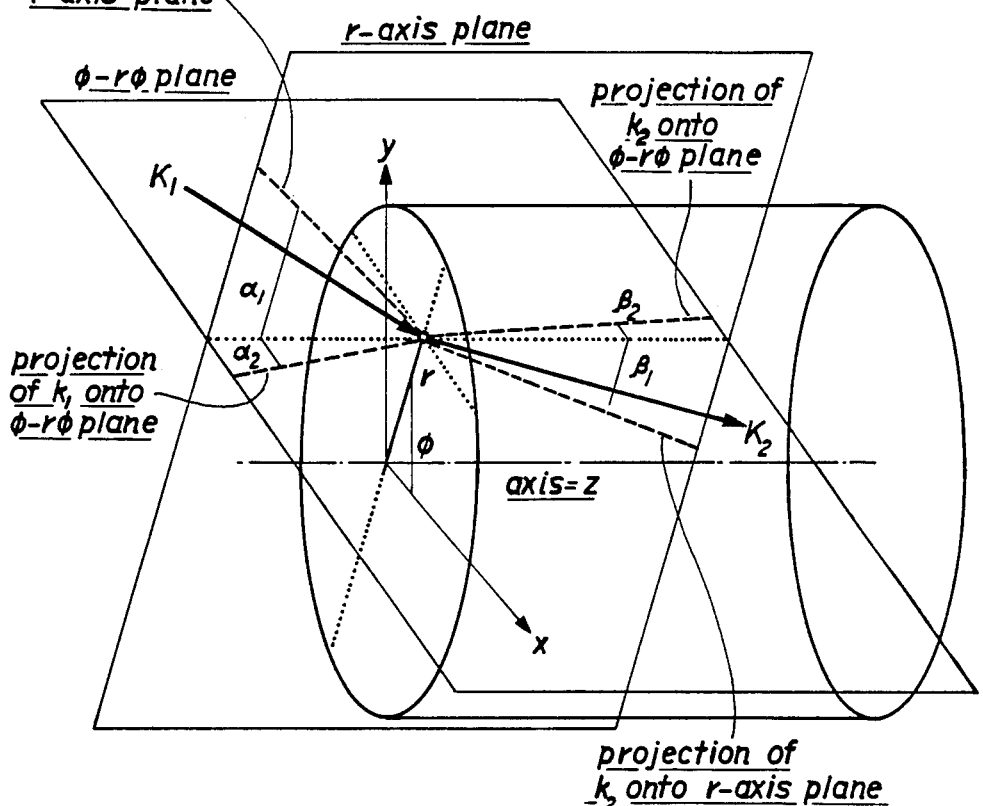
FIG. 2 depicts beam angles inside a fiber.

As indicated in the following analysis and summary, waveguide recording using composite photorefractive matrices such as the matrix 10, FIG. 1, provides improvements as a result of longer interaction length, energy channeling, and selective control over independent recording or interaction regions in at least image recording-related and signal processing-related areas:

1. Longer Interaction Length a. Superposition of Recordings

The available index modulation of the phase recording material is increased as a result of the longer interaction length compared with typical bulk materials. Equation 17 shows the dependency of the number of pages on effective length, indicating that a longer interaction length implies that an increased number of pages may be superimposed.

b. Larger Recording Region

Since the beams are reflecting back and forth within the fiber or cubit, they will intersect and interfere many times, as indicated by equation 16. This leads to an effective increase in the volume grating thickness associated with the recording.

Since the change in index is normally very small, for all practical purposes the efficiency expressed in equation 20 improves with increasing thickness. From this equation, it can be seen also that the recording efficiency can be optimized by choosing the correct crystallyte length. Previously it has been difficult to make bulk crystals having a small absorption coefficient thick enough to obtain maximum efficiency.

c. Discriminate More Pages

From equation 21, it can be seen that a long crystallyte or fiber length implies a large angular sensitivity, which in turn allows many holograms to be superimposed. From the data taken to date, we have determined that the angular selectivity is actually greater than predicted by equation 21, indicating that equation 21 provides a lower bound for this quantity. Though the detailed reasons for this improved performance are not fully understood, it appears likely that wave guiding is responsible for the improvement.

d. Lower Crosstalk Between Pages

The increased angular sensitivity of the media reduces cross coupling between multiple holograms for a given angular separation between them. In accordance with equations 24 and 26, the upper bound on the number of pages increases as a direct function of the length of the fiber.

2. Selective Control a. Electric Field Enhancement

The composite structure of crystallytes or cubits allows individual application of electrical or heating treatments to enhance or reduce the photorefractive performance of individual elements. The ability to selectively alter photorefractive properties of cubits or fibers is very useful, for example, in pattern recognition or defect enhancement applications. In these applications, dynamic filters may be synthesized to enhance or reduce, for example, certain spatial frequency components of the signal. The enhancement procedure has been discussed above.

b. Fixing

The composite structure of the crystallytes or cubits also allows selective application of voltage for electric fixing or selective application of heat for thermal fixing.

The applied voltage necessary to cause voltage fixing depends on the dimensions of the material (i.e., on the field strength). Since the width of the fibers or cubits is relatively small, voltages as small as about 100 volts can be used, as contrasted with several kilovolts for typical application using bulk materials of cm size.

c. Examples

Referring to FIGS. 5–8, phase recordings were made using a system 10 containing a single fiber 11 or a matrix of nine fibers 11—11 of 0.05 percent Cerium doped SBN:60. The fibers 11—11 were 0.5 to 2.0 mm in diameter and 3.00 to 8.00 mm in length. The crystal axis was oriented along the fiber axis as a result of the fiber growing procedure. The fibers were also poled along this axis. Both co-propagating and counter-propagating recording configurations were used.

Figure 8:
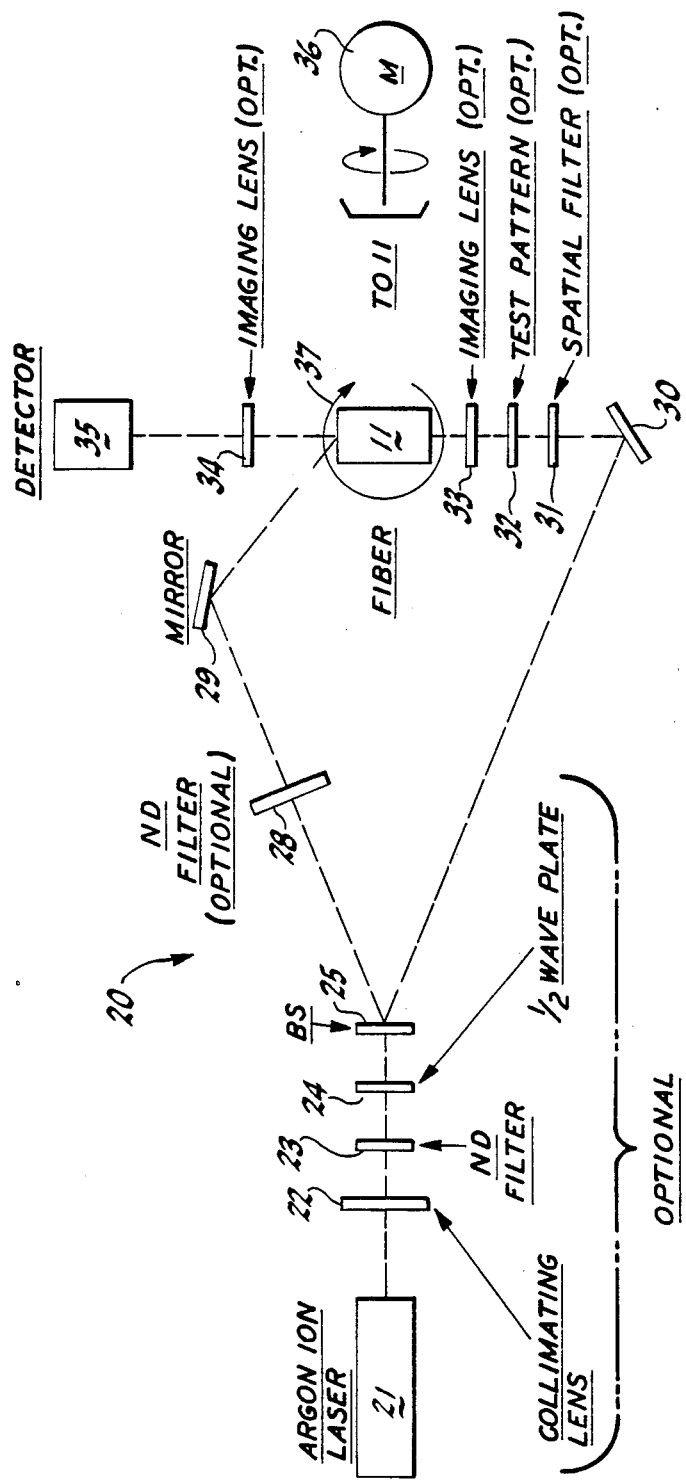
FIG. 8 is a schematic illustration of an experimental arrangement for testing the holographic recording operation of the system of FIG. 5.

Referring to FIG. 8, recording setup 20 was used to take measurements both in (1) two wave mixing recordings of approximately 1 mm diameter collimated Gaussian beams and (2) Fourier transform hologram recordings of an Air Force RES 1 test pattern 32. The recording set-up used an argon ion laser 21 tuned to either 488 nm or 514 nm in addition to a collimating lens 22, a neutral density filter 23 and a one-half wave plate 24, the latter three components being optional. The one-half wave plate 24 was used to rotate the polarization of the ion beam. Beam splitter 25 was used to split the coherent laser-like beam into a reference beam path 26 and an object beam 27. An optional neutral density filter 28 was used to control the power balance between the reference beam 26 and the object beam 27. Mirrors 29 and 30 directed the reference and object beams to the fiber 11 at selected angles of incidence and provided adjustment of the beam separation (the spatial frequency of the recording). Optionally, a spatial filter 31, the Air Force RES 1 test pattern 32 and an imaging lens 33 were incorporated in the object beam path 27. The magnitude of the intensity of the reconstructed beam was measured by a detector 35, which preferably was a photodiode or CCD array detector. A second optional imaging lens 34 was incorporated in the beam path between the fiber 11 and the detector 35 for the purpose of imaging the reconstructed output. Adjustment of the incident or entrance angle of the reference beam path 26 was provided by mounting the fiber 11 on the shaft of a stepper motor 36 so that the motor rotated the fiber along path 37 about the entrance spot of the beam 26 on the fiber.

A high intensity incoherent light source (not shown) may also be used for purging the fiber of any effects from previous recording. This step is not always necessary and is only discussed herein by way of example.

Both two wave mixing and Fourier transform recording use all the above-enumerated components with the following exceptions: the collimating lens 22 was used only for two wave mixing; and the spatial filter 31 (used to expand the beam), the test pattern 32 and the imaging lens 33 were used only for Fourier transform recording.

1. Transmission Properties

The transmission and absorption properties of the fibers may be controlled during the fiber growth procedure. As an example Ce doping tends to increase absorption of blue radiation and enhances performance in the red. The amount of absorption is determined by the additive and concentration. For example, adding 0.05% Ce to SBN:60 reduces the absorption length for the 514.5 nm wavelength to approximately 2–3 inverse mm. For longer fibers, the concentration should be reduced to avoid strong absorption and reduced signal strength. In certain applications which want to use the red region of the wavelength spectrum (such as applications using laser diodes), high levels of Ce doping, as an example, may be useful to enhance the photorefractive response of the fibers as compared with pure SBN fibers.

2. Write Saturation

Figure 9:
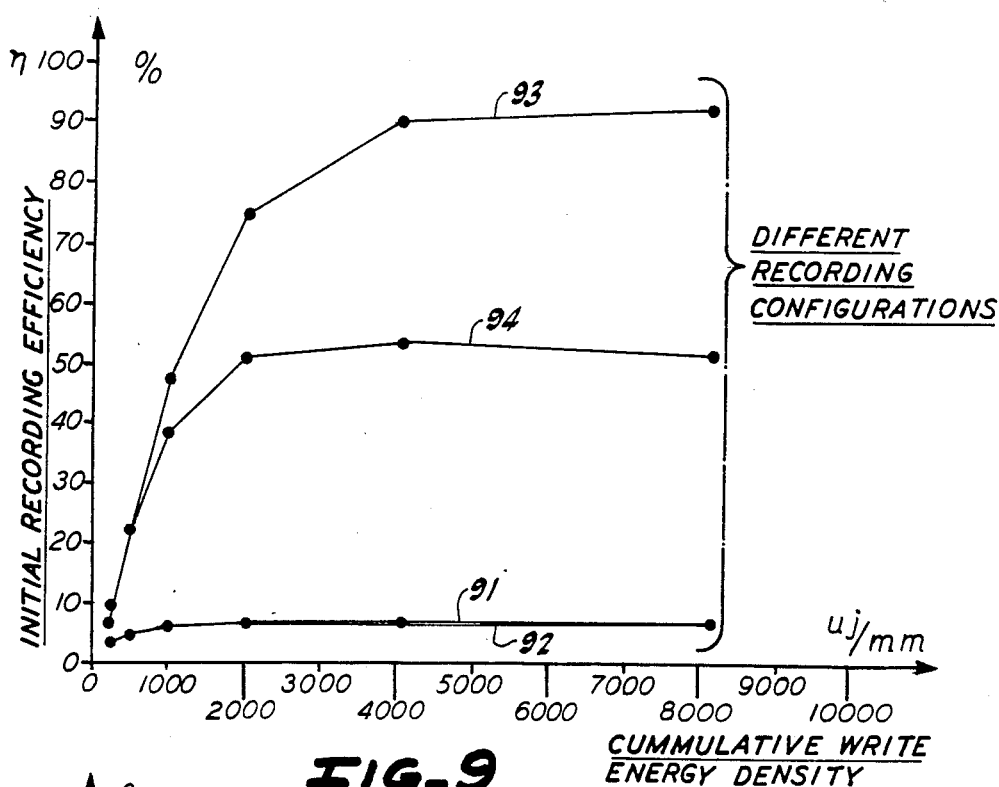
FIG. 9 depicts the measurements taken for saturation curves for various recording configurations using the arrangement of FIG. 8.

The magnitude of the reconstructed beam in a holographic recording increases as a function of cumulative recording energy and is measured for various reference beam angles in a counter-propagating recording configuration. These measurements are referred to here as write saturation curves. FIG. 9 shows this write saturation curve in a counter-propagating recording configuration for various beam directions relative to the poling direction and for various beam polarizations.

Curves 91 and 92 in FIG. 9 correspond to reconstructions where the reconstruction beam propagates counter to the direction of poling. Curves 93 and 94 correspond to reconstructions in case the reconstruction beam propagates in the direction of poling. Curves 91 and 93 correspond to ordinary polarized light reconstructions while 92 and 94 correspond to extraordinary polarizations. As would be expected, the reconstruction in the direction of the poling is most efficient. The saturation curves exhibit a behavior similar to that observed for holographic recording in bulk SBN crystals.

Figure 10:
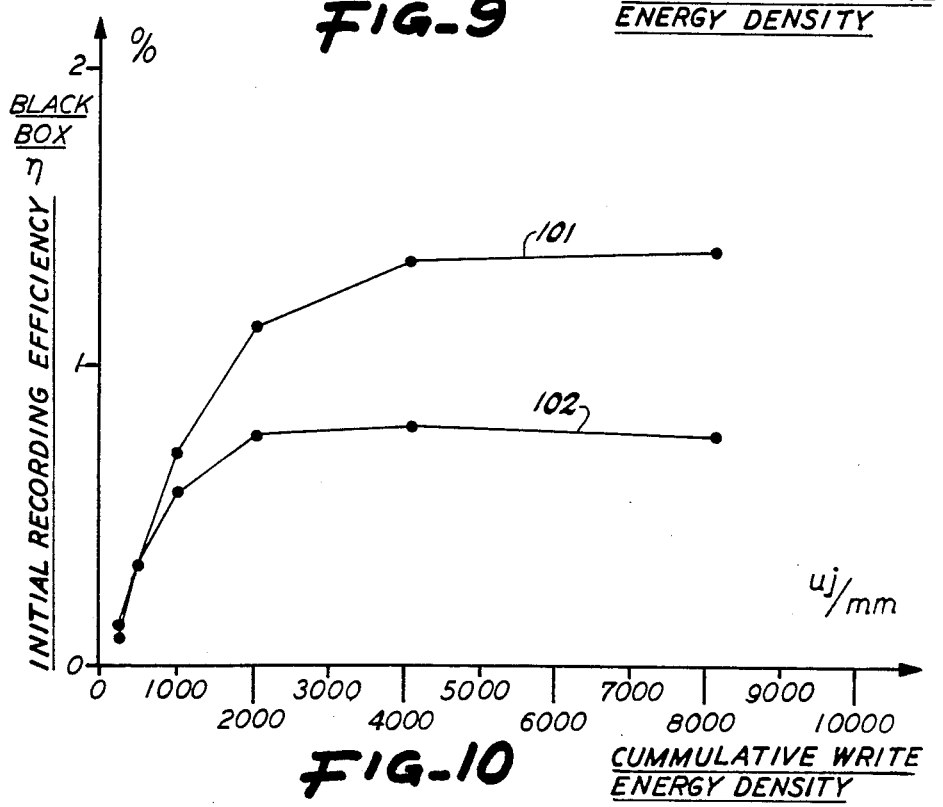
FIG. 10 depicts the measurements taken for saturation curves using black box efficiency for various recording configurations using the arrangement of FIG. 8.

The efficiency for these experiments is customarily calculated from the ratio of the reconstructed beam power to the power associated with the exiting reference beam in case of no recording. A more realistic computation measure might be what we term the "black box" efficiency. This efficiency is the ratio of the reconstructed beam power to the reference beam input power. FIG. 10 shows these results. The reconstruction is in the direction of poling with curve 101 corresponding to an ordinarily polarized light recording beam while 102 represents extraordinarily polarized beams. These "black box" efficiencies appear fairly modest as a result of strong absorption in these fibers. When factoring out the effects of absorption, the efficiency of recording is very high. At saturation, almost all energy is transferred from the reconstruction to the reconstructed beam, when properly accounting for absorption.

3. MTF

Figure 11:
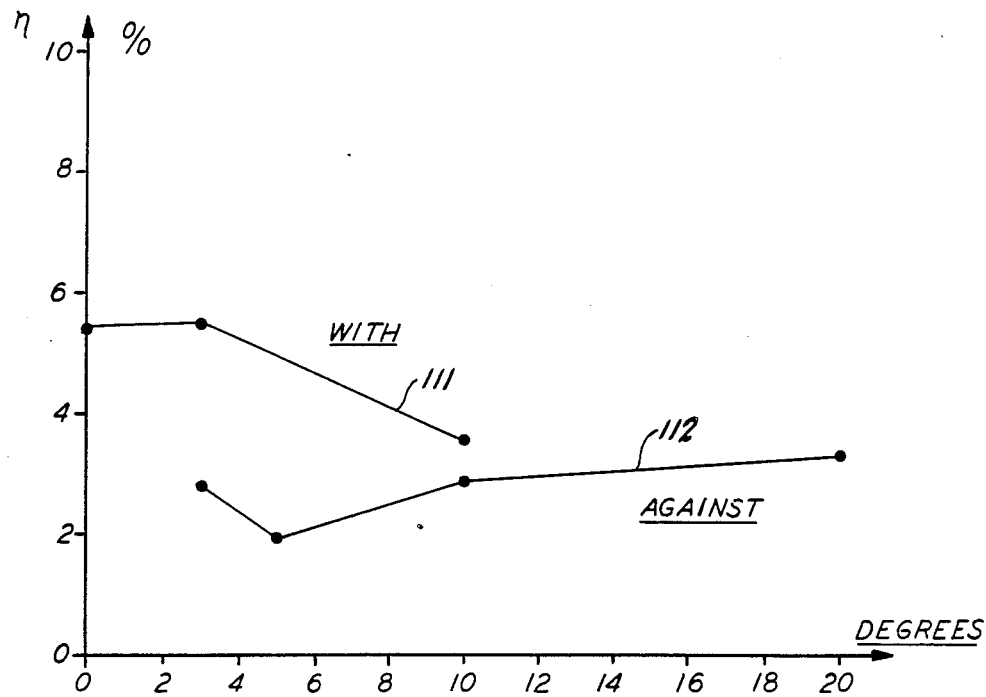
FIG. 11 depicts the measurements taken for starting efficiency versus the off-axis entrance angle of the reference beam during recording using the arrangement of FIG. 8.

The recorded image efficiency, $\eta$, for a given write energy density is also measured for various reference beam angles relative to the fiber axis in a counter-propagating recording configuration. These measurements provide partial MTF curves 111, 112, FIG. 11, for counter-propagating recording in SBN fiber.

4. Read destruction

The destruction rate of the holographic recording for different accumulations of reconstruction beam energy is also measured.

Figure 12:
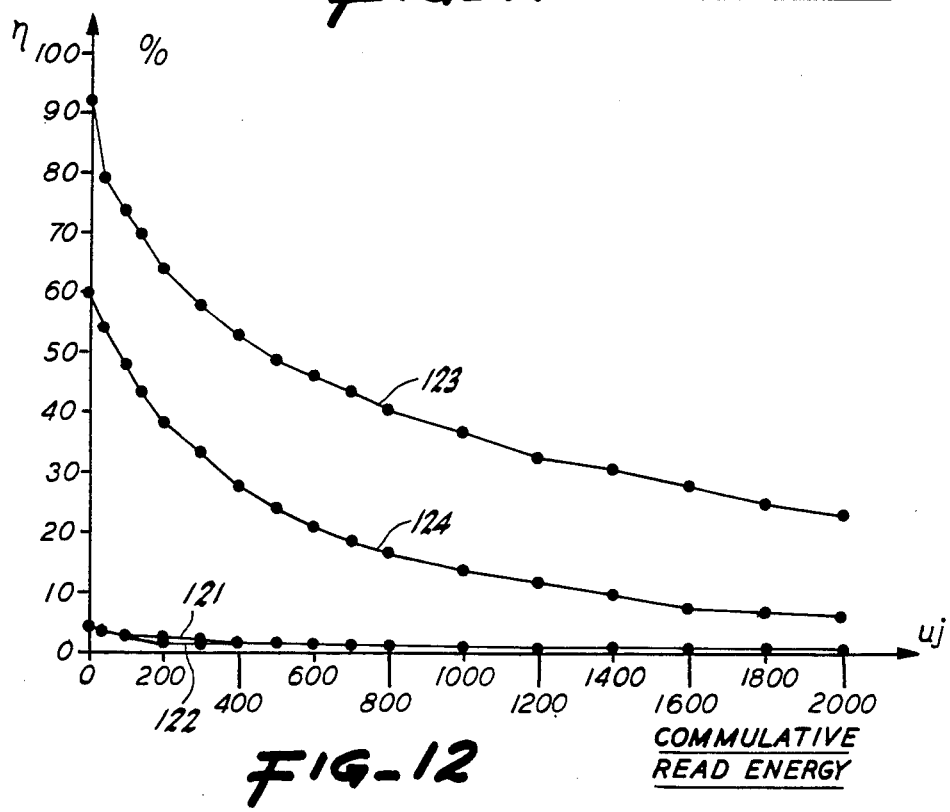
FIG. 12 depicts the measurements taken for read destruct curves for various recording configurations using the arrangement of FIG. 8.

Curves 121 and 122 in FIG. 12 correspond to reconstructions where the reconstruction beam propagates counter to the direction of poling. Curves 123 and 124 correspond to reconstructions where the reconstruction beam propagates in the direction of poling. Curves 121 and 123 correspond to vertically polarized light reconstructions while 122 and 124 correspond to horizontal polarization of the reconstruction beam.

5. Angular Sensitivity

Figure 13:
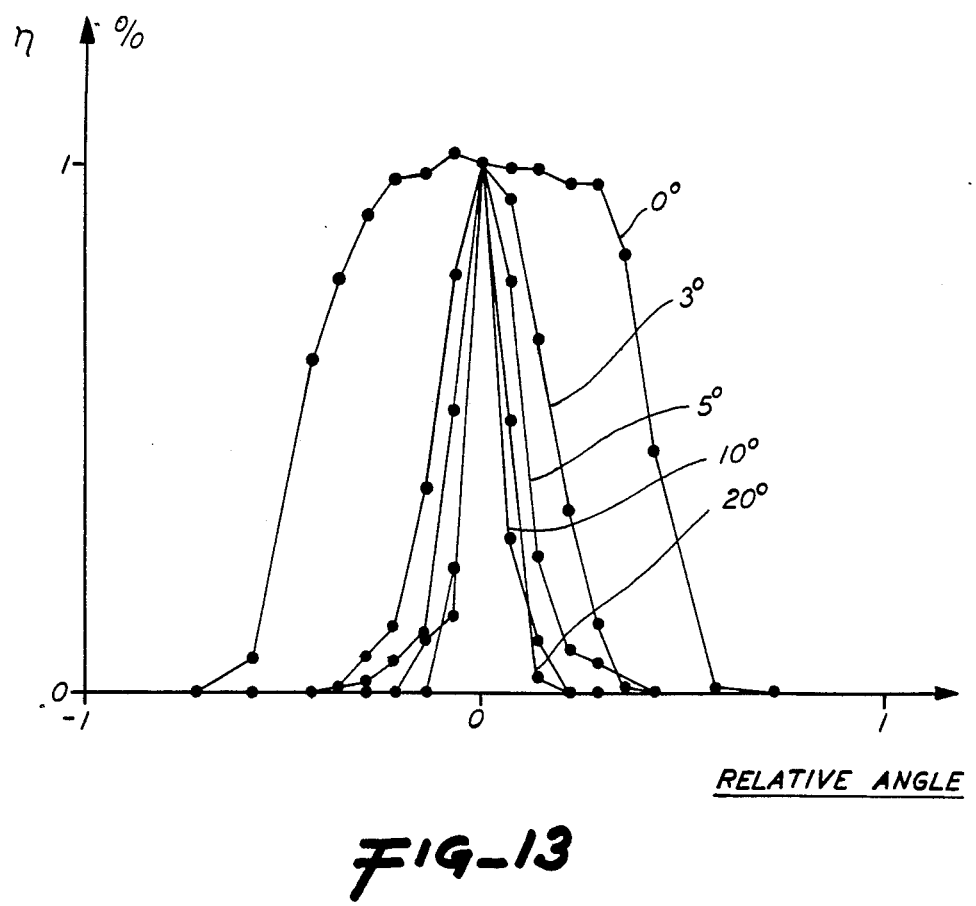
FIG. 13 depicts the measurements taken for the Bragg angle selectivity during reconstruction, for recordings at different off-axis angles of the reference beam using the arrangement of FIG. 8.

The angular sensitivity with respect to the Bragg angle for holograms recorded in both a co-propagating and counter-propagating configuration is measured as a function of the reference beam angle. The reference beam angle is also varied during recording resulting in different Bragg angles. These measurements are carried out for both two wave mixing of colluminated beams and for recording of the Fourier transform of a Airforce RES 1 test pattern. FIG. 13 show these angular results.

The 0° curve on FIG. 13 corresponds to an on axis recording, the 5° curve to a 5 degree off axis reference beam recording, and so forth. It can be seen that the angular sensitivity is modest when the reference beam is close to parallel to the axis, however, for larger off-axis reference beam angles the angular sensitivity increases substantially at a rate faster than would be the case for similar recording in bulk material. This improved performance is significant for data storage applications, as explained above as well as optical interconnect or crossbar switch applications, to mention a few. As a result of the angular spectrum of the test target, the angular sensitivity of the image recording is less than for the collimated beam recording, in accordance with the discussion above.

Thus, there has been described preferred and alternative embodiments of unique composite photorefractive holographic imaging arrays and techniques for selectively activating matrix elements thereby selectively modifying optical information.

What is claimed is:

1. In an optical recording system, the improvement comprising at least two photorefractive crystallytes, wherein said crystallytes are capable of being selectively addressed for optical holographic recording, storage and reconstruction.

2. The system of claim 1, further comprising means for forming a hologram image at said crystallytes for storage therein; and means for reconstructing said hologram.

3. The system of claim 2, further comprising means for applying voltages selectively to said photorefractive crystallytes to selectively control at least one of optical recording and reconstruction of the spatial frequency components of holograms associated with individual crystallytes.

4. The system of claim 1, wherein said crystallytes are positioned in a geometric array corresponding to the spatial frequency components of an associated Fourier transform of an image.

5. The system of claim 1, further comprising means mounting said photorefractive crystallytes at selective spaced positions in a two-dimensional array.

6. The system of claim 1, further comprising means mounting said photorefractive crystallytes at selective spaced positions in a three-dimensional array.

7. The system of claim 1, further comprising means mounting said photorefractive crystallytes at selective spaced positions in a rectangular array.

8. The system of claim 1, wherein said crystallytes are cubits.

9. The system of claim 1, wherein said crystallytes are fibers.

10. The system of claim 1, further comprising means for selectively controlling the temperature of said individual crystallytes to provide thermal fixing.

11. The system of claim 1, wherein the photorefractive crystallytes are arranged in a two-dimensional array.

12. The system of claim 1, wherein the photorefractive crystallytes are arranged in a row-by-column array.

13. In a signal processing system, the improvement comprising at least two photorefractive crystallytes, wherein said crystallytes are capable of being selectively addressed for optical signal processing.

14. The system of claim 13, further comprising means for forming a hologram image at said crystallytes for storage therein; and means for reconstructing said hologram.

15. The system of claim 14, further comprising means for applying voltages selectively to said photorefractive crystallytes to selectively control at least one of optical recording and reconstruction of the spatial frequency components of holograms associated with individual crystallytes.

16. The system of claim 13, wherein said crystallytes are positioned in a geometric array corresponding to at least certain spatial frequency components of an associated Fourier transform of an image.

17. The system of claim 13, further comprising means mounting said photorefractive crystallytes at selective spaced positions in a two-dimensional array.

18. The system of claim 13, further comprising means mounting said photorefractive crystallytes at selective spaced positions in a three-dimensional array.

19. The system of claim 13, further comprising means mounting said photorefractive crystallytes at selective spaced positions in a rectangular array.

20. The system of claim 13, wherein said crystallytes are cubits.

21. The system of claim 13, wherein said crystallytes are fibers.

22. The system of claim 13, further comprising means for selectively controlling the temperature of said individual crystallytes to provide thermal fixing.

23. The system of claim 13, wherein the photorefractive crystallytes are arranged in a two-dimensional array.

24. The system of claim 13, wherein the photorefractive crystallytes are arranged in a row-by-column array.

25. An optical array comprising at least two photorefractive crystallytes capable of being selectively addressed for at least one of optical signal processing or halographic recording.

26. A method for selectively processing an optical signal, comprising providing at least a plurality of photorefractive elements for recording at least certain spatial frequency components of an associated optical image; and selectively activating said elements to enhance or diminish said associated spatial frequency components.

* * * * *